United States Patent [19]

Martin

[11] Patent Number: 4,930,020

[45] Date of Patent: May 29, 1990

[54] FACSIMILE TRANSMISSION OF PHOTOGRAPHIC IMAGES

[76] Inventor: James F. Martin, 6914 Woodhaven Rd., NW., Roanoke, Va. 24019

[21] Appl. No.: 947,390

[22] Filed: Dec. 29, 1986

[51] Int. Cl.$^5$ .............................................. H04N 1/00
[52] U.S. Cl. .................................. 358/400; 430/396; 430/6
[58] Field of Search ............... 358/280, 283, 298, 400, 358/406, 456; 350/314, 318, 322, 321; 430/6, 396

[56] References Cited

U.S. PATENT DOCUMENTS 4,308,326  12/1981  Wirth ........................................ 430/6
4,516,175  5/1988  Jung et al. ............................ 358/283
4,600,666  7/1986  Zink ..................................... 350/322

Primary Examiner—Edward L. Coles, Sr.
Attorney, Agent, or Firm—Edward R. Gates

[57] ABSTRACT

A photographic image is prepared for facsimile transmission by photocopying the photographic image onto a sheet of paper through a partially transparent screen. The screen may comprise a plurality of spaced dots on a sheet in which one of the sheet and dots are transparent and the other opaque to light transmission whereby the photocopy has reproduced on it the picture and the pattern of the dots with either the dots or the spaces between the dots forming the image of the picture.

10 Claims, 2 Drawing Sheets

FACSIMILE TRANSMISSION OF PHOTOGRAPHIC IMAGES

BACKGROUND OF THE INVENTION

This invention relates to a method for preparing a picture for facsimile transmission and the picture prepared according to the described method. The invention also relates to a device useful in preparing a picture for facsimile transmission.

Conventional facsimile equipment does not transmit photographic images well. Conventional equipment is designed to transmit black images only. It cannot transmit shades or tones between black and white (gray tones). Instead, gray tones are read and transmitted as black or white and most of the information and detail of a photographic image is lost in the transmission. Although new and expensive facsimile equipment that reads and transmits gray tones is now on the market, its ability to do so is minimal, and most of the information and detail of the photographic image still is lost.

It is an object of the invention to provide an image prepared from a photograph that is capable of being transmitted through conventional facsimile equipment without loss of the information and detail contained in the image.

Another object of the invention is to provide an image prepared from a photograph, which image contains regions depicting the gray tone regions of the photograph and capable of being transmitted accurately through conventional facsimile equipment.

Another object of the invention is to provide a device useful in preparing a photographic image for transmission over conventional facsimile equipment.

Still another object of the invention is to provide an inexpensive method for preparing a photographic image so that the prepared image may be transmitted over conventional facsimile equipment without loss of the information and detail contained in the prepared image.

SUMMARY OF THE INVENTION

According to the invention, a photographic image is prepared for facsimile transmission by photocopying the photographic image onto a sheet of paper through a partially transparent screen. The screen may comprise a plurality of spaced dots on a sheet in which one of the sheet and dots are transparent and the other opaque to light transmission whereby the photocopy has reproduced on it the picture and the pattern of the dots with either the dots or the spaces between the dots forming the image of the picture. When the spaces form the image, the dots on the screen are opaque and the transparent portion of the screen is on the order of 70 percent to 85 percent thereof, and most preferably about 80 percent, with the transparent portion homogeneously dispersed throughout the screen. The dots on the photocopy are preferably a color that effectively transmits as white on a facsimile transmission machine. The dots on the photocopy are preferably between about 48 and 52 lines per inch and have a size such that the photocopy has a gray tone of between about 15 and 30 percent.

Preferably the screen is a transparent flexible sheet between about 0.001 and 0.016 inches and is formed of acetate. When the photocopy is prepared from the photographic image without enlargement, the dots on the screen are preferably dispersed at even intervals over a surface of the sheet, the density of the dots being between 48 and 52 lines per inch and the gray tone of the sheet being between 15 and 30 percent.

Once the photocopy is prepared from the photographic image, the photocopy is placed in the transmitting end of facsimile equipment at one location and the transmitted image is taken from the receiving end of the facsimile equipment at another location.

DESCRIPTION OF THE PREFERRED EMBODIMENT OF THE INVENTION

Figure 1:
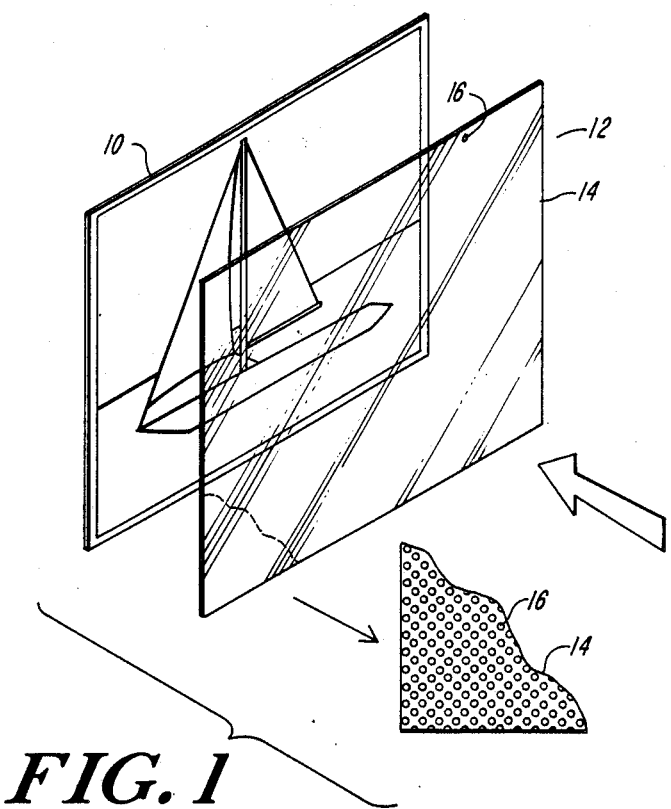
FIG. 1 schematically represents the screen of the invention overlaying a photograph.

According to a preferred embodiment of the invention, a photographic image is prepared for facsimile transmission by preparing a photocopy of a photograph through a screen. FIG. 1 schematically represents the placement of a photograph 10 and applicant's screen 12 relative to a photocopy light source (arrow) in the preparation of applicant's photocopy. The photograph 10 may be any conventional photograph, color or black and white. Applicant's screen 12 preferably comprises a transparent sheet 14 having a plurality of spaced dots 16 evenly dispersed over the surface of the sheet which dots comprise the non-transparent portion of the sheet.

The sheet 14 is preferably an acetate sheet having a thickness of between about 0.001 and 0.016 inches. Sheets below this range of thickness tend to be fragile and difficult to work with. Sheets above this range tend to remove the photograph too far from the surface of conventional photocopiers which have poor depth resolution and the resulting image is distorted. It will be recognized by those skilled in the art that applicant's sheet may be formed of other suitable material such as polyvinyl chloride and applicant does not intend to limit the scope of the invention to acetate sheets.

The dots 16 evenly dispersed over the surface of the sheet 14 are of a color that is read as white by the photocopier used to make the photocopy. In particularly, white dots or yellow dots are acceptable on most conventional photocopiers known to applicant. The dots may be square, round or any other shape that effectively divides the photographic image and reduces the contrast so that the photocopy may be transmitted on conventional facsimile equipment.

Screens particularly useful in preparing a same size photocopy for transmission on Canon facsimile equipment have 48-52 line/inch density of dots and a dot size such that the overall gray tone of the screen is between 20 and 25 percent. Screens with lower than 48 line/inch and 20 percent gray tone produce very coarse images and screens with greater than 52 line/inch and 25 percent gray tone produce very dark images. These particular parameters may vary slightly when using conventional facsimile equipment other than Canon.

The screens according to the invention are prepared following conventional photographic and printing techniques known to photoengravers and silk screeners. In particularly, a film negative may be made from commercially available black dot screens. If the black dot screen does not have the proper dot density and size, then the negative may be enlarged or reduced and the dot size etched to a smaller size to produce a negative with the proper dot density and size. Then a conventional metal or plastic printing plate is made from the negative and the dot pattern may be printed onto the acetate sheets. Alternatively, emulsions of this negative may be transferred along with the dots onto a silk screen for printing the dots on the acetate sheets. The applicant, however, does not intend to limit the scope of this invention by the particular method employed in making the screen.

Figure 2:
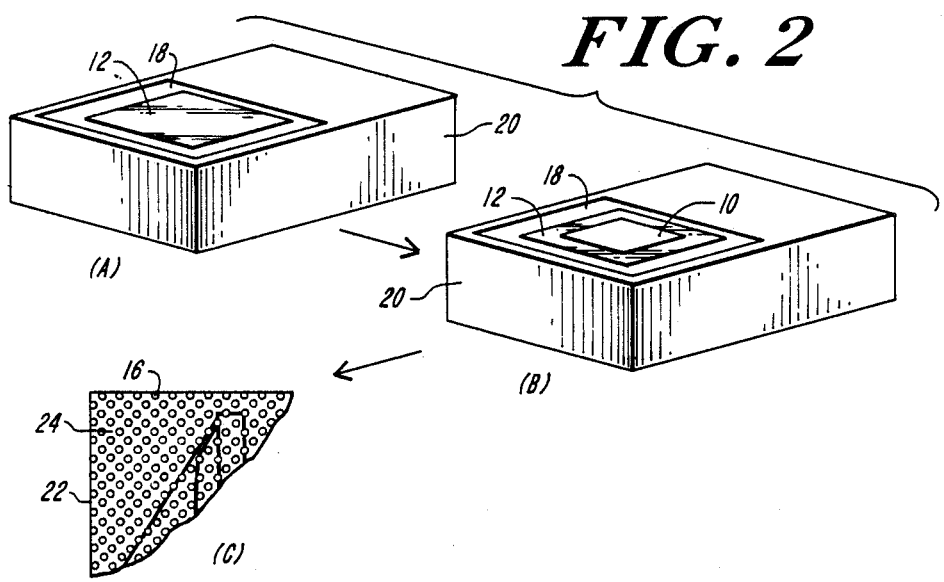
FIG. 2 schematically represents the conversion of a photographic image into a prepared image that is subsequently transmitted on facsimile equipment.

FIG. 2 schematically shows the preparation and facsimile transmission of a photocopied picture according to applicant's invention. The white dot screen 12 is placed on the document glass 18 of a photocopier 20 (FIG. 2a). Next, the photograph 10 is placed image side down on the white dot screen 12 (FIG. 2b). A photocopy 22 of the photograph 10 through the screen 12 then is made. The photocopy 22 (FIG. 2c) is essentially a piece of paper containing the image of the photograph dividing by the evenly spaced white dots 16 such that the spaces 24 between the dots 16 form the image of the photograph on the photocopy 22.

The exposure setting of the photocopier 20 should be on the order of about 25 to 30 percent gray which is the lightest or next to lightest setting on the gray scale of most conventional photocopiers. It should be understood that photocopiers vary in exposures from make to make and model to model. Also, the toner which is the black powder which makes the image on the plain paper varies from jet black to 85 percent gray in various copiers. Therefore, it should be recognized that minor adjustments in the exposure may have to be made to adjust for the particular conditions of the particular photocopier. The photocopy 22 is preferably between about 15 and 30 percent gray tone and the dots 16 on the photocopy 22 are between 48 and 52 line/inch.

Once the photocopy 22 through the screen is prepared, then the image is ready for transmission. The photocopy 22 is fed into the transmission end of the facsimile equipment according to the instructions of the facsimile equipment and the same image with little or no loss of detail will be received at the receiving end of the facsimile equipment.

It should be understood that various changes and modifications of the embodiment shown in the drawings may be made within the scope of the invention. For example, applicant has described preparing a photocopy without enlargement or reduction in size on the photograph. In this instance, the dot size and density on the screen will be identically represented on the photocopy prepared for transmission. Since the dot size and dot density on the photocopy is what is critical for transmitting an image accurately, it is possible to photocopy a photograph through a screen having a dot size and density other than described above, but under conditions of enlargement of reduction such that the photocopy has the desired dot size and density. Photocopies prepared in this manner are considered within the scope of the invention.

Applicant has described an embodiment where the dots are not transparent and the spaces between the dots are transparent. This arrangement could be reversed such that the dot regions are transparent and the spaces non-transparent. In this instance the image of the photograph or the photocopy would be formed by the dots rather than the spaces. Dot size and density would then have to be adjusted accordingly. For example, a photocopy having a dot density of between about 24 and 28 line/inch and a dot size such that the photocopy has a gray tone of between about 30 percent and 40 percent may work well where the dots form the image on the photocopy.

Thus it is intended that all matter contained in the above description or shown in the accompanying drawings shall be interpreted in an illustrative and not limiting sense.

I claim:

1. A method of preparing a photographic image for facsimile transmission comprising,
   preparing a photocopy of said photographic image through a screen comprising a plurality of spaced dots on said screen in which one of the screen and dots are transparent and the other opaque to light transmission, whereby the photocopy has reproduced thereon said photographic image and the pattern of said dots with either said dots or the spaces therebetween forming the image of said photographic image and wherein said screen is a transparent flexible sheet between about 0.001 and 0.016 inches in thickness, and said dots are white or yellow dots dispersed at even intervals over a surface of said sheet, the density of said dots being between 48 and 52 lines per inch and the overall gray tone of said sheet being between 15 and 30 percent.

2. The method as claimed in claim 1 further comprising placing said photocopy in a facsimile machine for transmission.

3. A method as claimed in claim 1 wherein said transparent flexible sheet is an acetate sheet between 0.001 and 0.016 inches in thickness.

4. A method for transmitting a photographic image through facsimile equipment having a transmission end and a receiving end comprising,
   preparing a photocopy of said photographic image through a screen comprising a plurality of spaced dots on a sheet in which one of the sheet and dots are transparent and the other opaque to light transmission whereby the photocopy has reproduced thereon said photographic image and the pattern of said dots with either said dots or the spaces therebetween forming the image of said picture,
   transmitting said photocopy in a conventional fashion through said facsimile equipment from said transmission end, and
   receiving said transmission at said receiving end.

5. A method as claimed as claimed in claim 4 wherein said screen is a transparent flexible sheet between about 0.001 and 0.016 inches in thickness, and said dots are white or yellow dots dispersed at even intervals over a surface of said sheet, the density of said dots being between 48 and 52 lines per inch and the overall gray tone of said sheet being between 15 and 30 percent.

6. A method as claimed in claim 5 wherein said transparent flexible sheet is an acetate sheet.

7. A method as claim in claim 6 wherein said photocopy has an overall gray tone of about 20 percent.

8. A picture prepared for use in facsimile transmission comprising,
   a sheet of paper having a picture formed thereon by photocopy means through a partially transparent screen in which the transparent portion of said screen is on the order of 70 percent to 85 percent thereof with the transparent portion homogeneously dispersed through said screen, and wherein said prepared picture is divided by a plurality of white dots, the density of said dots being between 48 and 52 line per inch.

9. A screen useful in photocopying a photographic image through said screen to form a prepared picture that may be transmitted without substantial loss of detail through conventional facsimile equipment comprising,
 a transparent flexible sheet between about 0.001 and 0.016 inches in thickness, and
 a plurality of white or yellow dots dispersed evenly over the surface of said sheet, the density of said dots being between about 48 and 52 lines per inch and the gray tone of said sheet being between 15 and 30 percent.

10. A screen as claimed in claim 9 wherein said sheet is an acetate sheet.

* * * * *